United States Patent
Li et al.

(10) Patent No.: US 11,443,684 B2
(45) Date of Patent: Sep. 13, 2022

(54) SHIFT REGISTER, GATE DRIVE CIRCUIT, DISPLAY PANEL AND DRIVING METHOD

(71) Applicant: Xiamen Tianma Micro-Electronics Co., Ltd., Xiamen (CN)

(72) Inventors: Donghua Li, Xiamen (CN); Xiaoli Wei, Xiamen (CN); Guochang Lai, Xiamen (CN); Junyi Li, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 82 days.

(21) Appl. No.: 17/006,755

(22) Filed: Aug. 28, 2020

(65) Prior Publication Data

US 2020/0394951 A1  Dec. 17, 2020

(30) Foreign Application Priority Data

Jun. 24, 2020  (CN) .......................... 202010591872.5

(51) Int. Cl.
  *G09G 3/36*  (2006.01)
  *G09G 3/20*  (2006.01)
  *G11C 19/28*  (2006.01)

(52) U.S. Cl.
  CPC ........... *G09G 3/2092* (2013.01); *G11C 19/28* (2013.01); *G09G 2310/0267* (2013.01); *G09G 2310/0286* (2013.01)

(58) Field of Classification Search
  CPC ... G09G 2310/0286; G09G 2310/0267; G09G 2330/021; G09G 3/3674; G09G 2310/0264; G09G 2310/0283; G09G 2320/0233; G09G 2320/0247; G09G 2320/043; G09G 3/2092; G11C 19/28
  See application file for complete search history.

(56) References Cited

U.S. PATENT DOCUMENTS

| 9,965,985 B2 * | 5/2018 | Wang ........................ G09G 3/20 |
| 2008/0100560 A1 * | 5/2008 | Na ........................ G09G 3/3677 |
| | | 345/101 |
| 2018/0090072 A1 * | 3/2018 | Sun ...................... G09G 3/3233 |
| 2018/0182300 A1 * | 6/2018 | Chen ................... G09G 3/3674 |
| 2018/0268914 A1 * | 9/2018 | Zhao .................... G11C 19/184 |
| 2019/0347996 A1 * | 11/2019 | Zhu .......................... G09G 3/20 |

FOREIGN PATENT DOCUMENTS

| CN | 102024410 A | 1/2011 |
| CN | 105118417 A | 12/2015 |
| CN | 107622746 A | 1/2018 |

* cited by examiner

*Primary Examiner* — Duc Q Dinh

(74) *Attorney, Agent, or Firm* — Alston & Bird LLP

(57) ABSTRACT

Provided are a shift register, a gate drive circuit, a display panel and a driving method. The shift register includes a first output module, a second output module, a first node, a second node, a first power supply signal terminal, a first clock signal terminal and a scan output terminal. The first output module and the second output module are electrically connected to the scan output terminal. The first output module is further electrically connected to the first power supply signal terminal and the first node. The first node is configured to control a conduction state of the first output module. The second output module is further electrically connected to the first clock signal terminal and the second node. The second node is configured to control a conduction state of the second output module. There is no capacitor in the first output module and/or the second output module.

19 Claims, 9 Drawing Sheets

SHIFT REGISTER, GATE DRIVE CIRCUIT, DISPLAY PANEL AND DRIVING METHOD

This application claims priority to the Chinese patent application No. CN 202010591872.5 filed on Jun. 24, 2020 at the CNIPA, the content of which is incorporated herein by reference in its entirety.

TECHNICAL FIELD

The present application relates to display technologies, and, in particular, to a shift register, a gate drive circuit, a display panel and a driving method.

BACKGROUND

With the development of display technologies, the application of display panels has become more widespread. For example, the display panels have been applied to products such as mobile phones, computers, tablet computers, electronic books and information inquiry machines, and also can be applied to instrument displays (such as an in-vehicle display), smart home control panels, et al.

The existing display panel enables pixels to be conductive by a scan circuit sequentially scanning each row of the pixels, so as to display a picture. The scan circuit includes multiple cascaded shift registers. The shift registers implements the function of scanning pixels row by row through a circuit structure which includes driving multiple thin film transistors and capacitors. During the process of scanning and driving, the capacitor is used for stabilizing a potential of a node in the circuit. However, when the potential of the node is converted between a high level and a low level, as the capacitor is charged or discharged, the capacitor's current leakage causes power consumption of the display panel.

SUMMARY

The present application provides a shift register, a gate drive circuit, a display panel and a driving method, to reduce the power consumption of the display panel.

In the first aspect, an embodiment of the present application provides a shift register. The shift register includes a first output module, a second output module, a first node, a second node, a first power supply signal terminal, a first clock signal terminal and a scan output terminal.

The first output module and the second output module are electrically connected to the scan output terminal. The first output module is further electrically connected to the first power supply signal terminal and the first node. The first node is configured to control a conduction state of the first output module. During the first output module conducting, a voltage signal input by the first power supply signal terminal is output to the scan output terminal.

The second output module is further electrically connected to the first clock signal terminal and the second node. The second node is configured to control a conduction state of the second output module. During the second output module conducting, a voltage signal input by the first clock signal terminal is output to the scan output terminal.

There is no capacitor in the first output module and/or the second output module.

In the second aspect, an embodiment of the present application further provides a gate drive circuit. The gate drive circuit includes cascaded shift registers as described in the first aspect. Each of the shift registers further includes a first shift input terminal.

The first shift input terminal of the shift register at the first level is electrically connected to a start signal input terminal of the gate drive circuit, and the scan output terminal of the shift register at the i-th level is electrically connected to the first shift input terminal of the shift register at the (i+1)-th level; where i is a positive integer.

In the third aspect, an embodiment of the present application further provides a display panel. The display panel includes a display region and a non-display region at least partially surrounding the display region. The non-display region is provided with a gate drive circuit, and the gate drive circuit is the gate drive circuit as described in the second aspect.

In the fourth aspect, an embodiment of the present application further provides a driving method of a display panel. The driving method of the display panel is applicable to the display panel provided by any embodiment of the present application. The method includes the following steps: a potential of the second node is controlled to enable the second output module to be conductive, and a voltage signal is input through the first clock signal terminal and is output to the scan output terminal; a potential of the first node is controlled to enable the first output module to be conductive, and a voltage signal is input through the first power supply signal terminal and is output to the scan output terminal.

The embodiments of the present application provide a shift register. The shift register includes the first output module, the second output module, the first node, the second node, the first power supply signal terminal, the first clock signal terminal and the scan output terminal. During the first output module conducting, a voltage signal input by the first power supply signal terminal is output to the scan output terminal. During the second output module conducting, a voltage signal input by the first clock signal terminal is output to the scan output terminal. Compared with the related art, there is no capacitor in the first output module and/or the second output module in the embodiments of the present application. By replacing additionally disposed capacitive elements in the related art with the capacitance of devices in the first output module and/or the second output module, the power consumption of the display panel caused by the current leakage of the capacitive elements, as the capacitive elements are charged and discharged, can be reduced, and the circuit layout architecture of the shift register can be optimized.

DETAILED DESCRIPTION

Figure 1:
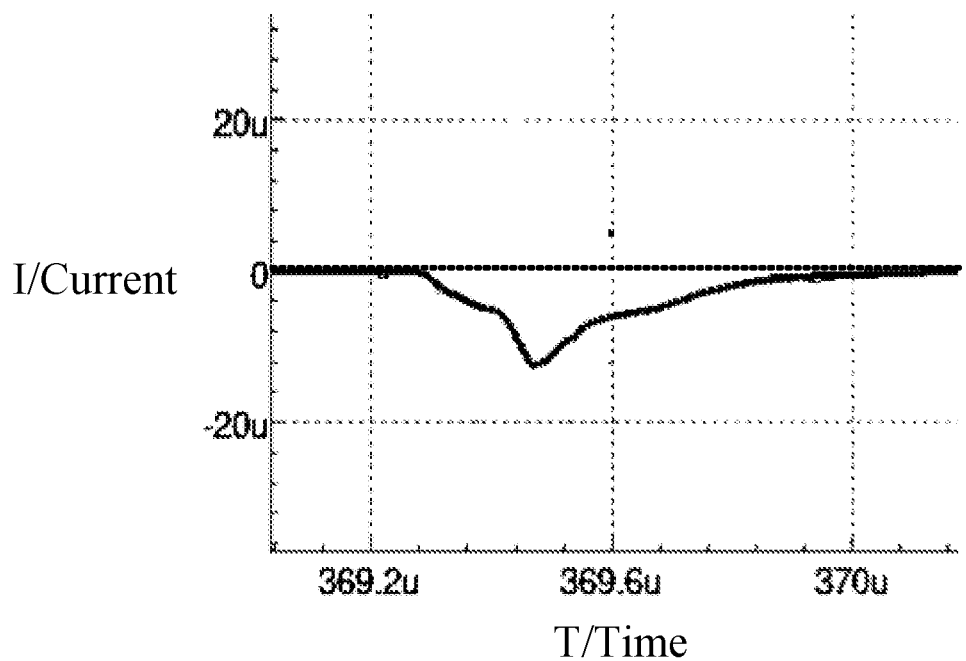
FIG. 1 is a chart illustrating current consumption from capacitors in an existing shift register.

The present application will be further described in detail hereinafter in conjunction with the drawings and embodiments. It is to be understood that the specific embodiments set forth herein are merely intended to illustrate and not to limit the present application. Additionally, it is to be noted that for ease of description, merely part, not all, of the structures related to the present application are illustrated in the drawings.

FIG. 1 is a chart illustrating current consumption from capacitors in an existing shift register. With reference to FIG. 1, when the potential of the circuit node in the shift register varies, leaking charge in the capacitor is flushed through the capacitor dielectrics, as the capacitor is charged or discharged, the capacitor's current leakage causes the power consumption of the display panel.

Figure 2:
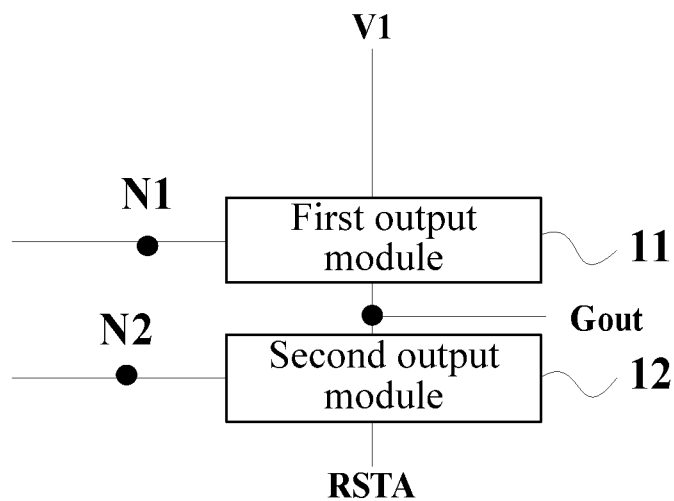
FIG. 2 is a block diagram of a shift register according to an embodiment of the present application.

In view of the above, an embodiment of the present application provides a scan circuit. FIG. 2 is a block diagram of a shift register according to the embodiment of the present application. With reference to FIG. 2, the shift register includes a first output module 11, a second output module 12, a first node N1, a second node N2, a first power supply signal terminal V1, a first clock signal terminal RSTA and a scan output terminal Gout.

The first output module 11 and the second output module 12 are electrically connected to the scan output terminal Gout. The first output module 11 is further electrically connected to the first power supply signal terminal V1 and the first node N1. The first node N1 is configured to control a conduction state of the first output module 11. During the first output module 11 conducting, a voltage signal input by the first power supply signal terminal V1 is output to the scan output terminal Gout. The second output module 12 is further electrically connected to the first clock signal terminal RSTA and the second node N2. The second node N2 is configured to control a conduction state of the second output module 12. During the second output module 12 conducting, a voltage signal input by the first clock signal terminal RSTA is output to the scan output terminal Gout. There is no capacitor in the first output module 11 and/or the second output module 12.

According to the shift register provided by the embodiment of the present application, by alternately conducting the first output module and the second output module, the output of different potentials of the scan output terminal Gout is thus implemented. Compared with the existing shift register, since there is no capacitor in the first output module and/or the second output module of the shift register provided by the embodiment of the present application, the charge or discharge of the capacitor in the first output module and/or the second output module is not be caused when the potential at the first node N1 and/or the potential at the second node N2 varies. Therefore, the increase of the power consumption of the display panel caused by the potential variation at the first node N1 and/or the second node N2 can be avoided. In the embodiment of the present application, the potential of the first node and/or the potential of the second node are held through the device capacitance of the elements in the first output module and/or the second output module, such that the output performance of the shift register is not affected. In addition, since the capacitor is omitted to be provided for the first output module and/or second output module of the shift register, the circuit architecture of the shift register can be simplified and the size of the shift register can be reduced.

Figure 3:
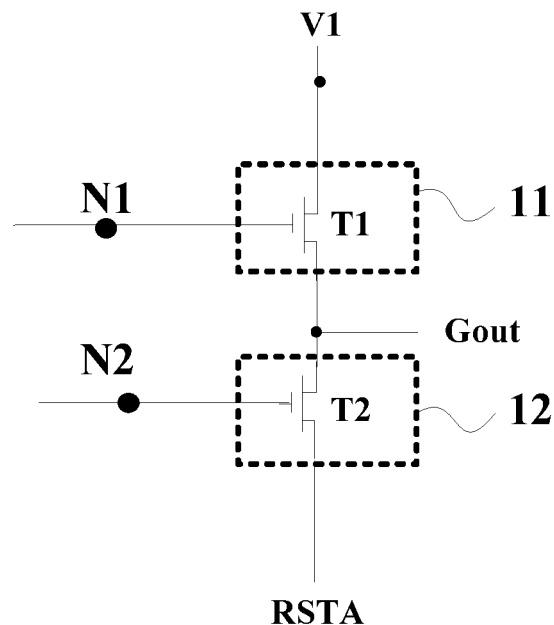
FIG. 3 is a block diagram of another shift register according to an embodiment of the present application.

FIG. 3 is a block diagram of another shift register according to an embodiment of the present application. On the basis of the above embodiment, in an embodiment, the first output module 11 includes a first transistor T1, and the second output module 12 includes a second transistor T2. A gate of the first transistor T1 is electrically connected to the first node N1. A first electrode of the first transistor T1 is electrically connected to the first power supply signal terminal V1. A second electrode of the first transistor T1 is electrically connected to the scan output terminal Gout. A gate of the second transistor T2 is electrically connected to the second node N2. A first electrode of the second transistor T2 is electrically connected to the first clock signal terminal RSTA. A second electrode of the second transistor T2 is electrically connected to the scan output terminal Gout.

Exemplarily, the first transistor T1 and the second transistor T2 are N-type transistors. When the first node N1 is at a low level and the second node N2 is at a high level, the first transistor T1 is turned off, the second transistor T2 is turned on, and a voltage signal input by the first clock signal terminal RSTA is output to the scan output terminal Gout. When the first node N1 is at a high level and the second node N2 is at a low level, the first transistor T1 is turned on, the second transistor T2 is turned off, and a voltage signal input by the first power supply signal terminal V1 is output to the scan output terminal Gout. Since there is no capacitor in the first output module and the second output module, the device capacitance of the first transistor T1 and the second transistor T2 is used for replacing the potential hold function of the capacitor in the related art. On the one hand, the power consumption is reduced compared with the related art. On the other hand, the number of components in the shift register is reduced, and the space occupied by the circuit is reduced, facilitating the narrow border layout of the non-display region in the display panel.

The larger the channel's width/length (W/L) ratio of a transistor is, the larger the device capacitance of the transistor will be. The higher the refresh frequency of the display panel, the less the requirements for the hold time of the node potential. Therefore, the smaller the required device capacitance of the transistors in the first output module and/or the second output module is, the less the channel's W/L ratio of the corresponding transistor will be. Therefore, the device sizes of the first transistor and/or the second transistor may be set according to the actual product requirements.

In order to adapt to the driving capability of the panel, currently, the size of the transistor in the shift register is generally large, so that the device capacitance of the transistor is also large, and the device capacitance can replace the original capacitor in the shift register. In an embodiment, the channel's W/L ratio of the first transistor and/or the channel's W/L ratio of the second transistor is greater than 45. The capacitor of the existing shift register is generally designed to have capacitance of 200fF (femto-Farad), and the device capacitance of the transistor with channel's W/L ratio greater than 45 can meet requirements for the capacitance of the existing shift register.

On the basis of the above embodiments, in an embodiment, the first transistor T1 and/or the second transistor T2 may be double-gate transistors. The double-gate transistor has relatively strong suppressing leakage current capability. In this embodiment, the first transistor T1 and/or the second transistor T2 is set as the double-gate transistor, which may reduce the leakage current of the first transistor T1 and/or the second transistor T2, and maintain the potential stability of the first node N1 and/or the second node N2.

It is to be noted that detailed circuit structures of several shift registers are merely exemplarily shown in the embodiments of the present application, but are not intended to limit the internal circuit structure of the shift register provided by the embodiments of present application. The core idea of the present application is that there is no capacitor in the first output module and/or the second output module of the shift register, and the capacitor in the existing shift register is replaced with the capacitance of the devices in the first output module and/or the second output module, such that the shift registers meeting the above structure requirements all are within the scope of the present application.

Figure 4:
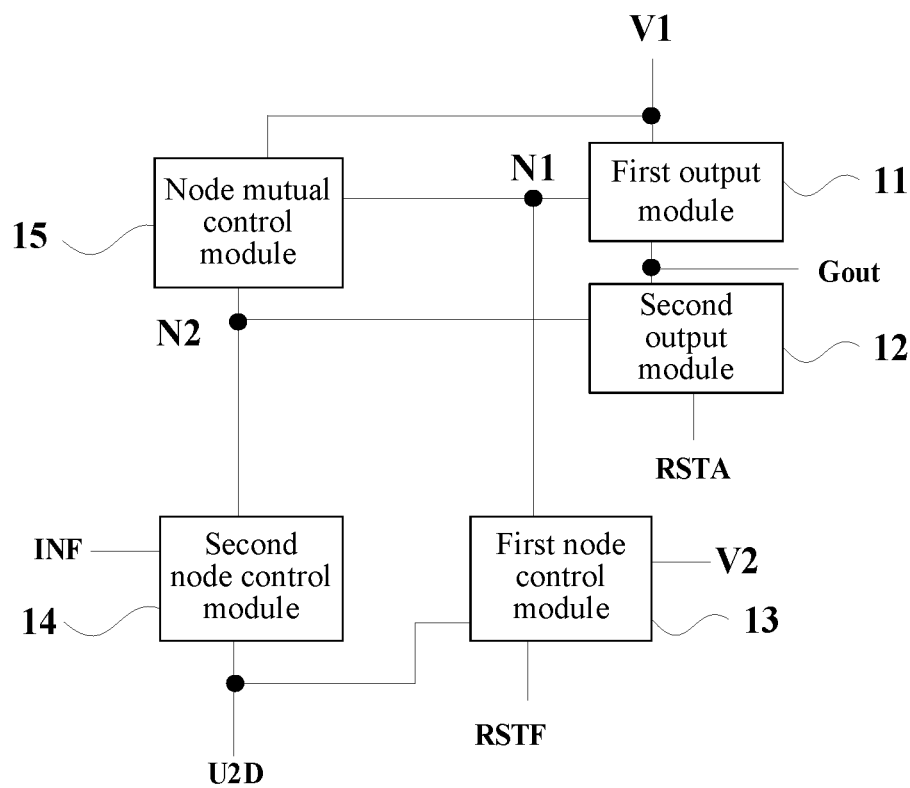
FIG. 4 is a block diagram of another shift register according to an embodiment of the present application.

FIG. 4 is a block diagram of another shift register according to an embodiment of the present application. As shown in FIG. 4, the shift register further includes a first node control module 13, a second node control module 14, a node mutual control module 15, a first shift input terminal INF, a first level signal terminal U2D, a second clock signal terminal RSTF and a second power supply signal terminal V2.

The first node control module 13 and the second node control module 14 are electrically connected to the first level signal terminal U2D. The first node control module 13 is further electrically connected to the second clock signal terminal RSTF, the second power supply signal terminal V2 and the first node N1. The first node control module 13 is configured to control a potential of the first node N1 according to a voltage signal input by the first level signal terminal U2D, a voltage signal input by the second clock signal terminal RSTF and a voltage signal input by the second power supply signal terminal V2. The second node control module 14 is further electrically connected to the first shift input terminal INF and the second node N2. The second node control module 14 is configured to control a potential of the second node N2 according to a voltage signal input by the first level signal terminal U2D and a voltage signal input by the first shift input terminal INF. The node mutual control module 15 is electrically connected to the first node N1, the second node N2 and the first power supply signal terminal V1. The node mutual control module 15 is configured to control the potential of the second node N2 according to the potential of the first node N1, or control the potential of the first node N1 according to the potential of the second node N2. The first node N1 is configured to control a conduction state of the first output module 11. During the first output module 11 conducting, a voltage signal input by the first power supply signal terminal V1 is output to the scan output terminal Gout. The second node N2 is configured to control a conduction state of the second output module 12. During the second output module 12 conducting, a voltage signal input by the first clock signal terminal RSTA is output to the scan output terminal Gout.

Figure 5:
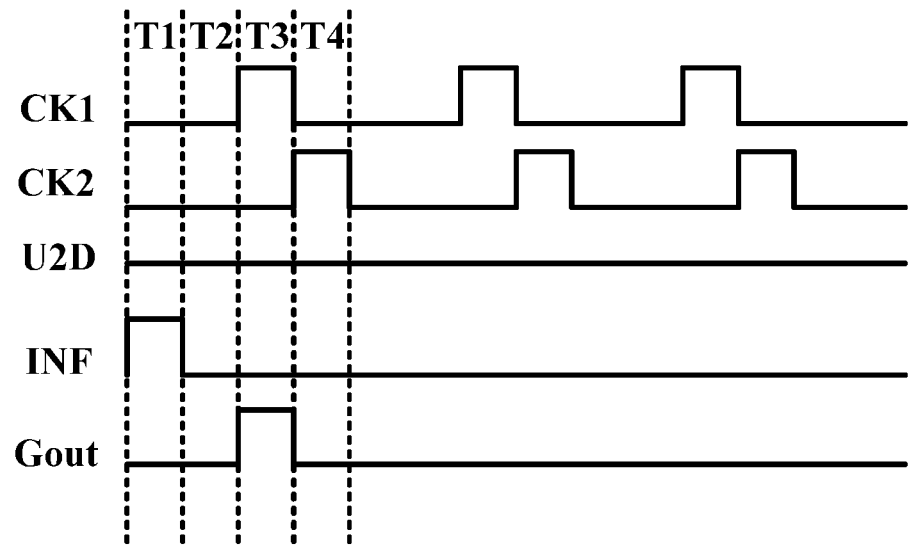
FIG. 5 is a timing sequence of a shift register according to an embodiment of the present application.

FIG. 5 is a timing sequence of a shift register according to an embodiment of the present application. The first clock signal terminal RSTA inputs a first clock signal, the second clock signal terminal RSTF inputs a second clock signal, the first level signal terminal U2D inputs a first level signal, the first shift input terminal INF inputs a first shift signal, and the scan output terminal Gout outputs a scan signal.

In order to clearly indicate each signal terminal and the input or output signal, in the embodiment of the present application, the signal terminal and the signal input or output by this signal terminal are denoted by the same reference numeral. For example, the first clock signal terminal and the first clock signal both are denoted by RSTA.

Exemplarily, that the first level signal is at a high level, the first power supply signal terminal V1 is at a low level, and the second power supply signal V2 is at a high level is taken as an example. The driving process of the shift register includes the following stages: a first stage T1, a second stage T2, a third stage T3 and a fourth stage T4.

At the first stage T1, a voltage signal input by the first shift input terminal INF on T5 (see FIG. 6) is at a high level, the second node control module 14 pulls the second node N2 up to a high level, the node mutual control module 15 pulls the first node N1 down to a low level, the first output module 11 is turned off, the second output module 12 is turned on, a voltage signal at a low level input by the first clock signal terminal RSTA is output to the scan output terminal Gout, and a voltage signal input by the scan output terminal Gout is at a low level.

At the second stage T2, a voltage signal input by the first shift input terminal INF on T5 is at a low level, the potential of the first node N1 and the potential of the second node N2 remain unchanged due to the storage function of the device capacitance of the circuit elements in the first output module 11 and the second output module 12, and the scan output terminal Gout maintains at a low level as the last stage.

At the third stage T3, a voltage signal input by the first shift input terminal INF on T5 is at a low level, a voltage signal input by the first clock signal terminal RSTA is at a high level, a voltage signal input by the second clock signal terminal RSTF is at a low level, the potential of the first node N1 and the potential of the second node N2 remain unchanged, the second output module 12 is turned on, a voltage signal at a high level input by the first clock signal terminal RSTA is output to the scan output terminal Gout, and a voltage signal input by the scan output terminal Gout is at a high level.

At the fourth stage T4, a voltage signal input by the first shift input terminal INF on T5 is at a low level, a voltage signal input by the first clock signal terminal RSTA is at a low level, a voltage signal input by the second clock signal terminal RSTF is at a high level, the first node control module 13 pulls the first node N1 up to a high level, the node mutual control module 15 pulls the second node N2 down to a low level, the first output module 11 is turned on, the second output module 12 is turned off, a voltage signal at a low level input by the first power supply signal terminal V1 is output to the scan output terminal Gout, and a voltage signal input by the scan output terminal Gout is at a low level.

It is to be noted that in the above embodiments, it is exemplarily illustrated that the first level signal is at a high level; the first power supply signal is at a low level; the second power supply signal is at a high level, and the first clock signal and the second clock signal are at active high level, which is not intended to limit the present application. In the other embodiments, the first level signal may be set at a low level, the first power supply signal may be set at a high level, the second power supply signal may be set at a low level, and the first clock signal and the second clock signal may be set at active low level. These signals may also be set as needed in actual applications.

Figure 6:
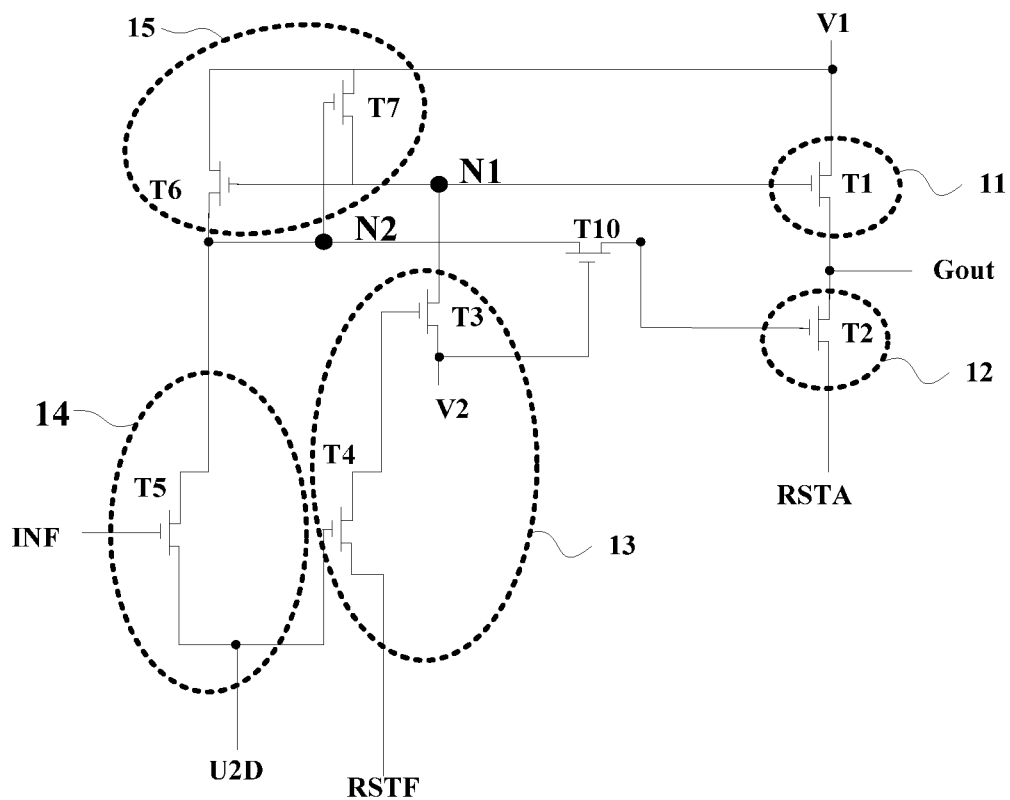
FIG. 6 is a circuit diagram of another shift register according to an embodiment of the present application.

FIG. 6 is a circuit diagram of another shift register according to an embodiment of the present application. As shown in FIG. 6, in an embodiment, the first node control module 13 includes a third transistor T3 and a fourth transistor T4. A gate of the third transistor T3 is electrically connected to a second electrode of the fourth transistor T4. A first electrode of the third transistor T3 is electrically connected to the second power supply signal terminal V2. A second electrode of the third transistor T3 is electrically connected to the first node N1. A first electrode of the fourth transistor T4 is electrically connected to the second clock signal terminal RSTF. A gate of the fourth transistor T4 is electrically connected to the first level signal terminal U2D.

The second node control module 14 includes a fifth transistor T5. A gate of the fifth transistor T5 is electrically connected to the first shift input terminal INF. A first electrode of the fifth transistor T5 is electrically connected to the first level signal terminal U2D. A second electrode of the fifth transistor T5 is electrically connected to the second node N2.

The node mutual control module 15 includes a sixth transistor T6 and a seventh transistor T7. A gate of the sixth transistor T6 is electrically connected to the first node N1. A first electrode of the sixth transistor T6 is electrically connected to the first power supply signal terminal V1. A second electrode of the sixth transistor T6 is electrically connected to the second node N2. A gate of the seventh transistor T7 is electrically connected to the second node N2. A first electrode of the seventh transistor T7 is electrically connected to the first power supply signal terminal V1. A second electrode of the seventh transistor T7 is electrically connected to the first node N1.

It is to be noted that when the shift register is applied to a display panel, the transistors in the shift register and transistors on the display panel may be manufactured in the same process flow, thereby saving the process flow and reducing the cost.

Figure 7:
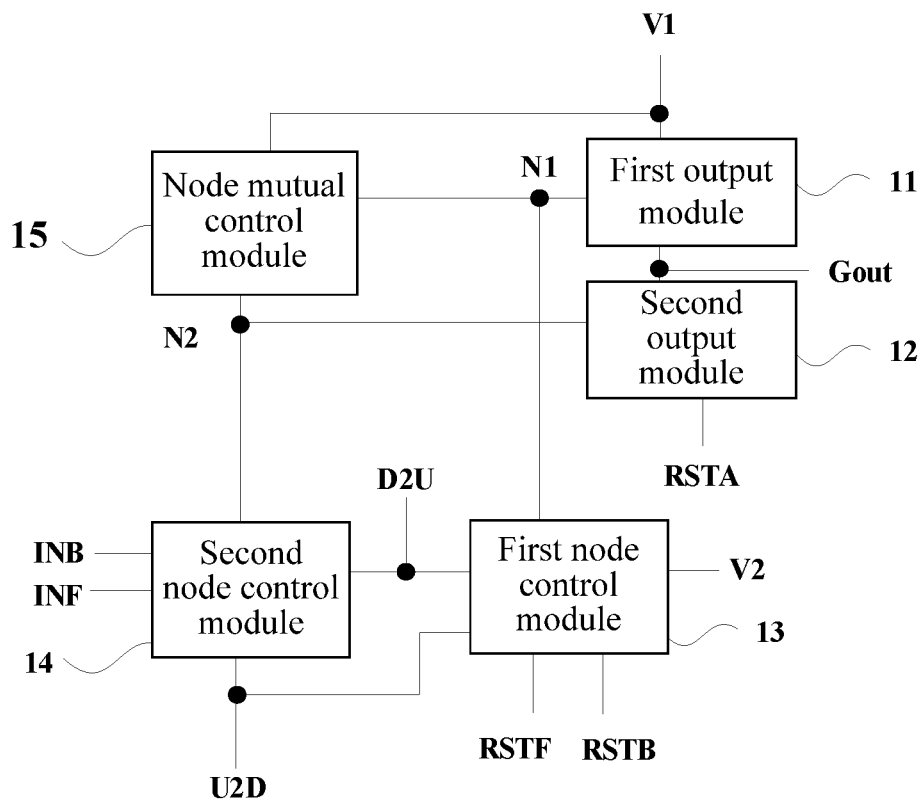
FIG. 7 is a block diagram of another shift register according to an embodiment of the present application.

FIG. 7 is a block diagram of another shift register according to an embodiment of the present application. As shown in FIG. 7, in an embodiment, on the basis of FIG. 4, the shift register further includes a second shift input terminal INB, a second level signal terminal D2U and a third clock signal terminal RSTB. The second node control module 14 and the first node control module 13 are electrically connected to the second level signal terminal D2U. The second node control module 14 is further electrically connected to the second shift input terminal INB. The third clock signal terminal RSTB is electrically connected to the first node control module 13. The first node control module 13 is configured to control the potential of the first node N1 according to a voltage signal input by the first level signal terminal U2D, a voltage signal input by the second level signal terminal D2U, a voltage signal input by the second clock signal terminal RSTF, a voltage signal input by the third clock signal terminal RSTB and a voltage signal input by the second power supply signal terminal V2. The second node control module 14 is configured to control the potential of the second node N2 according to a voltage signal input by the first level signal terminal U2D, a voltage signal input by the second level signal terminal D2U, a voltage signal input by the first shift input terminal INF and a voltage signal input by the second shift input terminal INB.

The shift register provided by the embodiment of the present application further includes the second shift input terminal INB, the second level signal terminal D2U and the third clock signal terminal RSTB, which may not only implement the forward scan as shown in FIG. 4, but also implement the reverse scan through the control of input signals of the second shift input terminal INB, the second level signal terminal D2U and the third clock signal terminal RSTB. That is, in the embodiment of the present application, a shift function of a pulse signal input by the first shift input terminal INF may be implemented, i.e., the forward scan, and a shift output of a pulse signal input by the second shift input terminal INB may be performed, i.e., the reverse scan. Those skilled in the art may understand that a driving process of the reverse scan is similar to that of the forward scan, and details are not described again.

Figure 8:
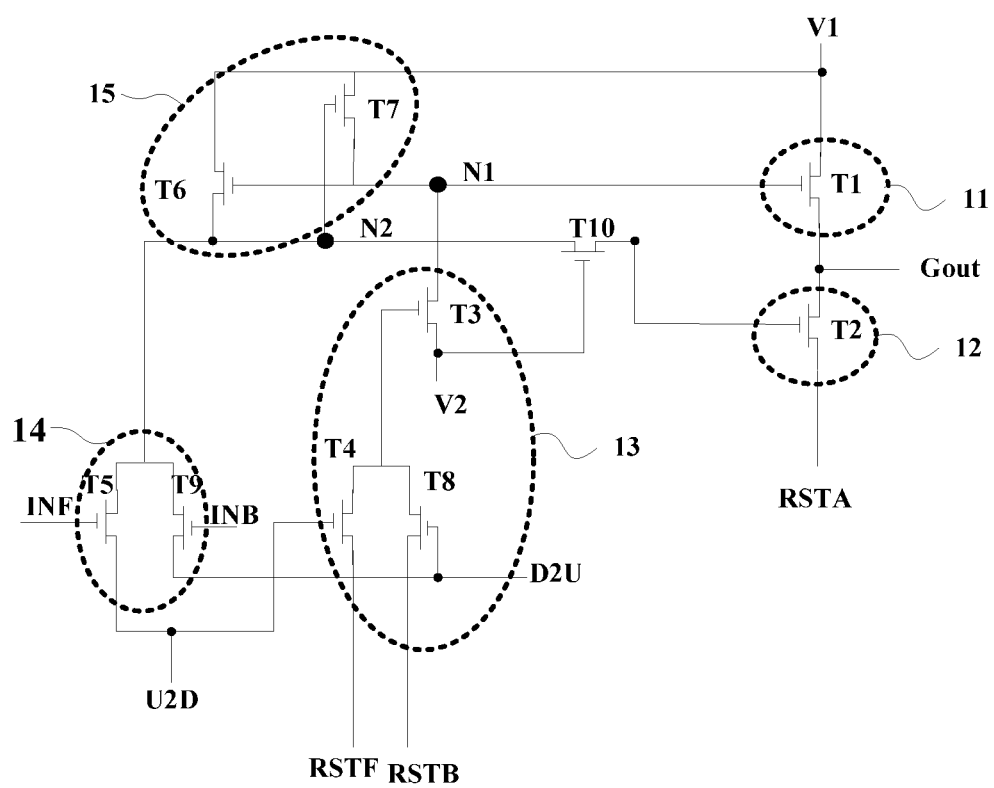
FIG. 8 is a circuit diagram of another shift register according to an embodiment of the present application.

FIG. 8 is a circuit diagram of another shift register according to an embodiment of the present application. As shown in FIG. 8, on the basis of the above embodiments, in an embodiment, the first node control module 13 includes the third transistor T3, the fourth transistor T4 and an eighth transistor T8. The second electrode of the fourth transistor T4 and a second electrode of the eighth transistor T8 are electrically connected to the gate of the third transistor T3. The first electrode of the third transistor T3 is electrically connected to the second power supply signal terminal V2. The second electrode of the third transistor T3 is electrically connected to the first node N1. The first electrode of the fourth transistor T4 is electrically connected to the second clock signal terminal RSTF. The gate of the fourth transistor T4 is electrically connected to the first level signal terminal U2D. A gate of the eighth transistor T8 is electrically connected to the second level signal terminal D2U. A first electrode of the eighth transistor T8 is electrically connected to the third clock signal terminal RSTB.

The second node control module 14 includes the fifth transistor t5 and a ninth transistor T9. The gate of the fifth transistor T5 is electrically connected to the first shift input terminal INF. The first electrode of the fifth transistor T5 is electrically connected to the first level signal terminal U2D. The second electrode of the fifth transistor T5 is electrically connected to the second node N2. A gate of the ninth transistor T9 is electrically connected to the second shift input terminal INB. A first electrode of the ninth transistor T9 is electrically connected to the second level signal terminal D2U. A second electrode of the ninth transistor T9 is electrically connected to the second node N2.

The node mutual control module 15 includes the sixth transistor T6 and the seventh transistor T7. The gate of the sixth transistor T6 is electrically connected to the first node N1. The first electrode of the sixth transistor T6 is electrically connected to the first power supply signal terminal V1. The second electrode of the sixth transistor T6 is electrically connected to the second node N2. The gate of the seventh transistor T7 is electrically connected to the second node N2. The first electrode of the seventh transistor T7 is electrically connected to the first power supply signal terminal V1. The second electrode of the seventh transistor T7 is electrically connected to the first node N1.

Figure 9:
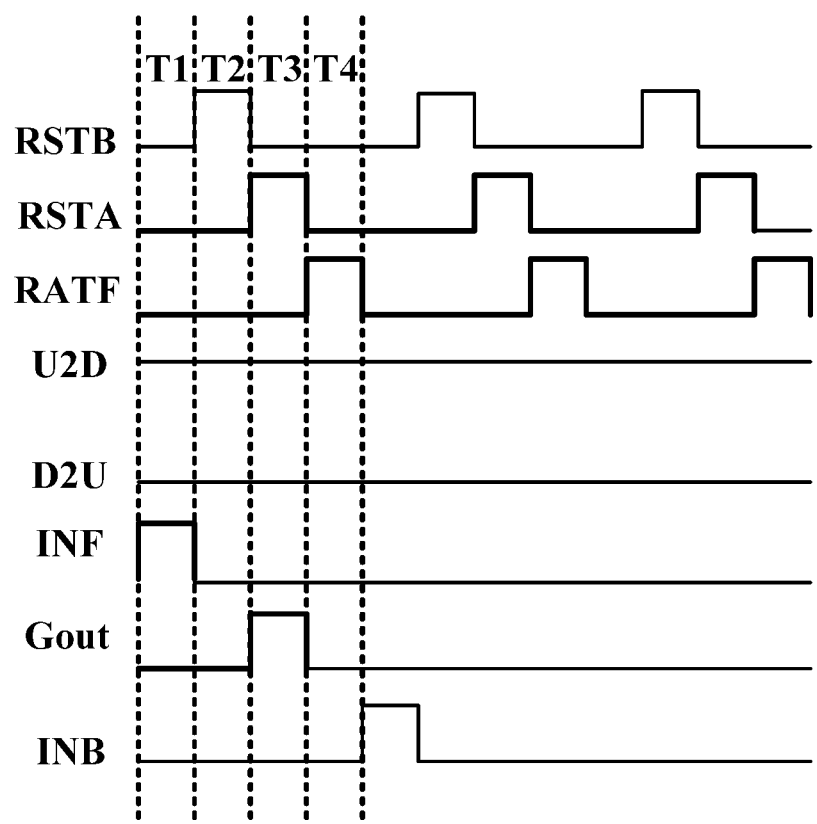
FIG. 9 is a timing sequence of a shift register according to an embodiment of the present application.

FIG. 9 shows timing sequences of a shift register according to an embodiment of the present application. Exemplarily, that each transistor of the shift register in FIG. 8 is an N-type transistor, a voltage signal input by the first level signal terminal U2D is at a high level, a voltage signal input by the second level signal terminal D2U is at a low level, a voltage signal input by the first power supply signal terminal V1 is at a low level, a voltage signal input by the second power supply signal terminal V2 is at a high level, and the forward scan is performed is taken as an example, and the driving process of the shift register includes a first stage T1, a second stage T2, a third stage T3 and a fourth stage T4 described below.

At the first stage T1, a voltage signal input by the first shift input terminal INF is at a high level, a voltage signal input by the first clock signal terminal RSTA is at a low level, a voltage signal input by the second clock signal terminal RSTF is at a low level, a voltage signal input by the third clock signal terminal RSTB is at a low level, a voltage signal input by the second shift input terminal INB is at a low level, the fifth transistor T5 in the second node control module 14 is turned on, the first level signal terminal U2D writes the first level signal into the second node N2, the potential of the second node N2 is pulled up, the seventh transistor T7 in the node mutual control module 15 is turned on, the first power supply signal terminal V1 writes the first power supply signal into the first node N1 through the seventh transistor T7, and the potential of the first node N1 is pulled down. The first transistor T1 in the first input module 11 is turned off, the second transistor T2 in the second output module 12 is turned on, and in this case, a voltage signal input by the first clock signal terminal RSTA is at a low level. Therefore, a voltage signal at a low level input by the first clock signal terminal RSTA is output to the scan output terminal Gout through the second transistor T2, and a voltage signal input by the scan output terminal Gout is at a low level.

At the second stage T2, a voltage signal input by the first shift input terminal INF is at a low level, a voltage signal input by the first clock signal terminal RSTA is at a low level, a voltage signal input by the second clock signal terminal RSTF is at a low level, a voltage signal input by the third clock signal terminal RSTB is at a high level, a voltage signal input by the second shift input terminal INB is at a low level, the potential of the first node N1 and the potential of the second node N2 remain unchanged due to the storage function of the device capacitance of the first transistor T1 in the first output module 11 and the second transistor T2 in the second output module 12, the first node N1 still remains at a low level, the second node N2 still remains at a high level, and the scan output terminal Gout maintains at a low level as the last stage.

At the third stage T3, a voltage signal input by the first shift input terminal INF is at a low level, a voltage signal input by the first clock signal terminal RSTA is at a high level, a voltage signal input by the second clock signal terminal RSTF is at a low level, a voltage signal input by the third clock signal terminal RSTB is at a low level, a voltage signal input by the second shift input terminal INB is at a low level, the potential of the first node N1 and the potential of the second node N2 remain unchanged, the first transistor T1 in the first output module 11 is turned off, the second transistor T2 in the second output module 12 is turned on, a voltage signal at a high level input by the first clock signal terminal RSTA is output to the scan output terminal Gout, and a voltage signal input by the scan output terminal Gout is at a high level.

At the fourth stage T4, a voltage signal input by the first shift input terminal INF is at a low level, a voltage signal input by the first clock signal terminal RSTA is at a low level, a voltage signal input by the second clock signal terminal RSTF is at a high level, a voltage signal input by the third clock signal terminal RSTB is at a low level, a voltage signal input by the second shift input terminal INB is at a low level, the fourth transistor T4 and the third transistor T3 in the first node control module 13 are turned on, the second power supply signal terminal V2 inputs the second power supply signal to the first node N1, the first node N1 is pulled up to a high level, the seventh transistor T7 in the node mutual control module 15 is turned on, the second node N2 is pulled down to a low level, the first transistor T1 in the first output module 11 is turned on, the second transistor T2 in the second output module 12 is turned off, the first power supply signal input by the first power supply signal terminal V1 is output to the scan output terminal Gout, and a voltage signal input by the scan output terminal Gout is at a low level.

In an embodiment, the shift register provided by the embodiment of the present application further includes a tenth transistor. Taking the circuit structure shown in FIG. 8 as an example, a gate of the tenth transistor T10 is electrically connected to the second power supply signal terminal V2; a first electrode of the tenth transistor T10 is electrically connected to the second node N2; and a second electrode of the tenth transistor T10 is electrically connected to the second output module 12.

The tenth transistor T10 provided in the embodiment of the present application can reduce the leakage current from the second node N2 to the second output module 12. In addition, the tenth transistor T10 can also block the current in the second output module 12 flowing back to the first node control module 13, the second node control module 14 and the node mutual control module 15, so as to prevent the components in the first node control module 13, the second node control module 14 and the node mutual control module 15 from being damaged.

In an embodiment, the channel's W/L ratio of the fifth transistor T5 is set at least two times or larger than the channel's W/L ratio of any transistor in the node mutual control module 15.

Since after the fifth transistor T5 is turned on, the on/off states of the seventh transistor T7 and the sixth transistor T6 are controlled to further control the potential of the first node N1 and the potential of the second node N2, the fifth transistor T5 needs to have a strong drive capability, so that fast control responses can be obtained for the potential of the first node N1 and the potential of the second node N2. In this case, in the embodiment of the present application, the channel's W/L ratio of the fifth transistor T5 is set at least two times or larger than the channel's W/L ratio of any transistor in the node mutual control module 15, so as to improve the drive capability of the fifth transistor T5.

In an embodiment, similar to the drive principle of the fifth transistor T5, in the embodiment of the present application the channel's W/L ratio of the ninth transistor T9 is set at least two times or larger than the channel's W/L ratio of any transistor in the node mutual control module 15, so as to improve the potential control response speeds of the first node N1 and the second node N2 in the process of the reverse scan.

It is to be noted that the above embodiments are illustrated by taking each transistor being the N-type transistor as an example, but are not intended to limit the present application. In other embodiments, each transistor may also be set to be a P-type transistor, or part of the transistors are set to be N-type transistors while part of the transistors are set to be P-type transistors, which can be set as needed in actual applications.

An embodiment of the present application further provides a gate drive circuit. The gate drive circuit includes cascaded shift registers as described in any one of the above embodiments. Each shift register further includes a first shift input terminal.

The first shift input terminal of the shift register at the first stage is electrically connected to a start signal input terminal of the gate drive circuit, and the scan output terminal of the shift register at the i-th stage is electrically connected to the first shift input terminal of the shift register at the (i+1)-th stage, where i is a positive integer.

The gate drive circuit provided by the embodiment of the present application also has the beneficial effects of the shift register described in the above embodiments. The similarities can be understood by referring to the above explanation and description on the shift register, which will not be repeated hereinafter.

Figure 10:
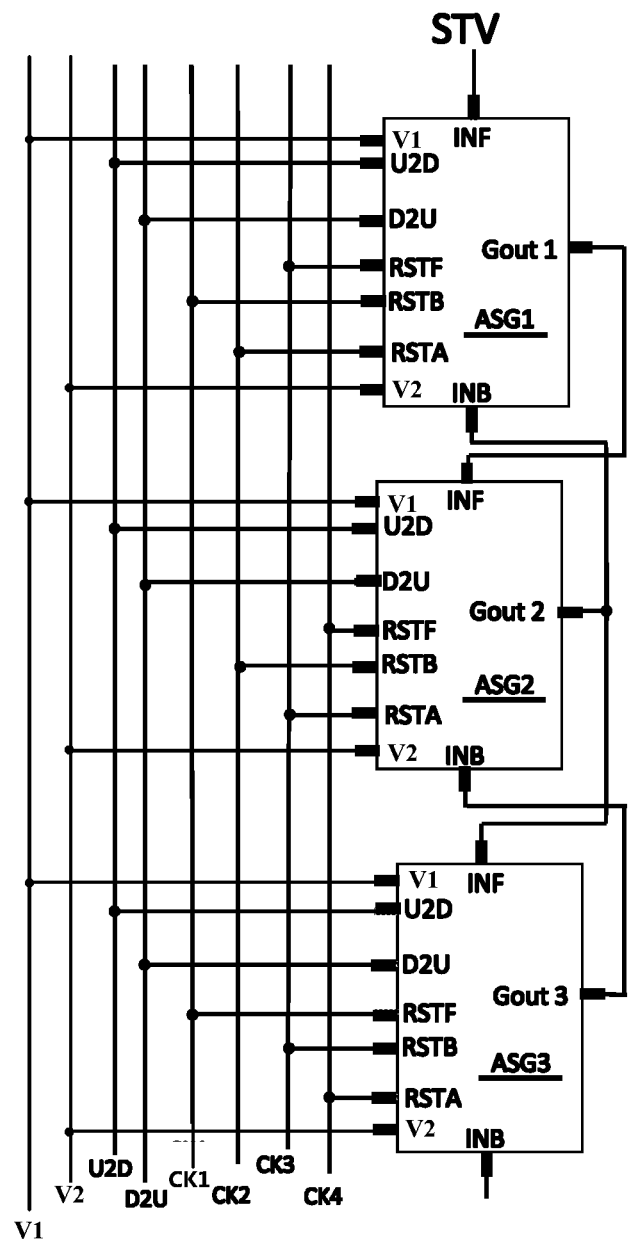
FIG. 10 is a block diagram of a gate drive circuit according to an embodiment of the present application.

FIG. 10 is a block diagram of a gate drive circuit according to an embodiment of the present application. With reference to FIG. 10, the gate drive circuit includes cascaded shift registers. FIG. 10 exemplarily shows three-stage shift registers, i.e., a shift register ASG1 at the first stage, a shift register ASG2 at the second stage and a shift register ASG3 at the third stage. The first shift input terminal INF of the shift register ASG1 at the first stage is electrically connected to the start signal input terminal STV of the gate drive circuit, and the scan output terminal Gout i of the shift register at the i-th stage is electrically connected to the first input terminal INF of the shift register at the (i+1)-th stage, where i is a positive integer.

The internal operation process of the shift register at each stage may be understood by referring to the above description, which will not be repeated here. On the basis of the above, the shift register ASG1 at the first stage is triggered by a voltage signal input by the start signal input terminal STV and then starts to operate; when the scan output terminal Gout i of the shift register at the i-th stage outputs a scan signal (for example, a valid pulse is at a high level), a voltage signal at a high level input by the first shift input terminal INF of the shift register at the (i+1)-th stage is triggered and the shift register at the (i+1)-th stage starts to operate.

On the basis of the above embodiments, in an embodiment, the shift register further includes a second shift input terminal INB. The scan output terminal Gout i+1 of the shift register at the (i+1)-th stage is electrically connected to the second shift input terminal INB of the shift register at the i-th stage, such that the shift register may perform both the forward scan and the reverse scan, where i is a positive integer.

In an embodiment, with reference to FIG. 10, when the gate drive circuit is applied to the display panel, the display panel is provided with four clock signal lines, i.e., CK1, CK2, CK3 and CK4 respectively, and is further provided with a first poser supply signal line V1, a second power supply signal line V2, a first level signal line U2D and a second level signal line D2U. Taking the three cascaded shift registers of the gate drive circuit as an example, the first level signal terminal U2D of the shift register at each stage is electrically connected to the first level signal line U2D (the first level signal line and the first level signal terminal are denoted by the same reference numeral). The first level signal line U2D is configured to provide the first level signal terminals U2D with the first level signal. The second level signal terminal D2U of the shift register at each stage is electrically connected to the second level signal line D2U (the second level signal line and the second level signal terminal are denoted by the same reference numeral). The second level signal line D2U is configured to provide the second level signal terminals D2U with the second level signal. The first power supply signal terminal V1 of the shift register at each stage is electrically connected to the first power supply signal line V1 (the first power supply signal line and the first power supply signal terminal are denoted by the same reference numeral). The second power supply signal terminal V2 of the shift register at each stage is electrically connected to the second power supply signal line V2 (the second power supply signal line and the second power supply signal terminal are denoted by the same reference numeral). The first clock signal terminal RSTA of the shift register at the first stage is electrically connected to CK2, the second clock signal terminal RSTF at the first stage is electrically connected to CK2, and the third clock signal terminal RSTB at the first stage is electrically connected to CK1. The first clock signal terminal RSTA of the shift register at the second stage is electrically connected to CK3, the second clock signal terminal RSTF at the second stage is electrically connected to CK4, and the third clock signal terminal RSTB at the second stage is electrically connected to CK2. The first clock signal terminal RSTA of the shift register at the third stage is electrically connected to CK4, the second clock signal terminal RSTF at the third stage is electrically connected to CK1, and the third clock signal terminal RSTB at the third stage is electrically connected to CK3. Signals input by the same clock signal terminals of two adjacent cascaded shift registers differ by one clock pulse.

Figure 11:
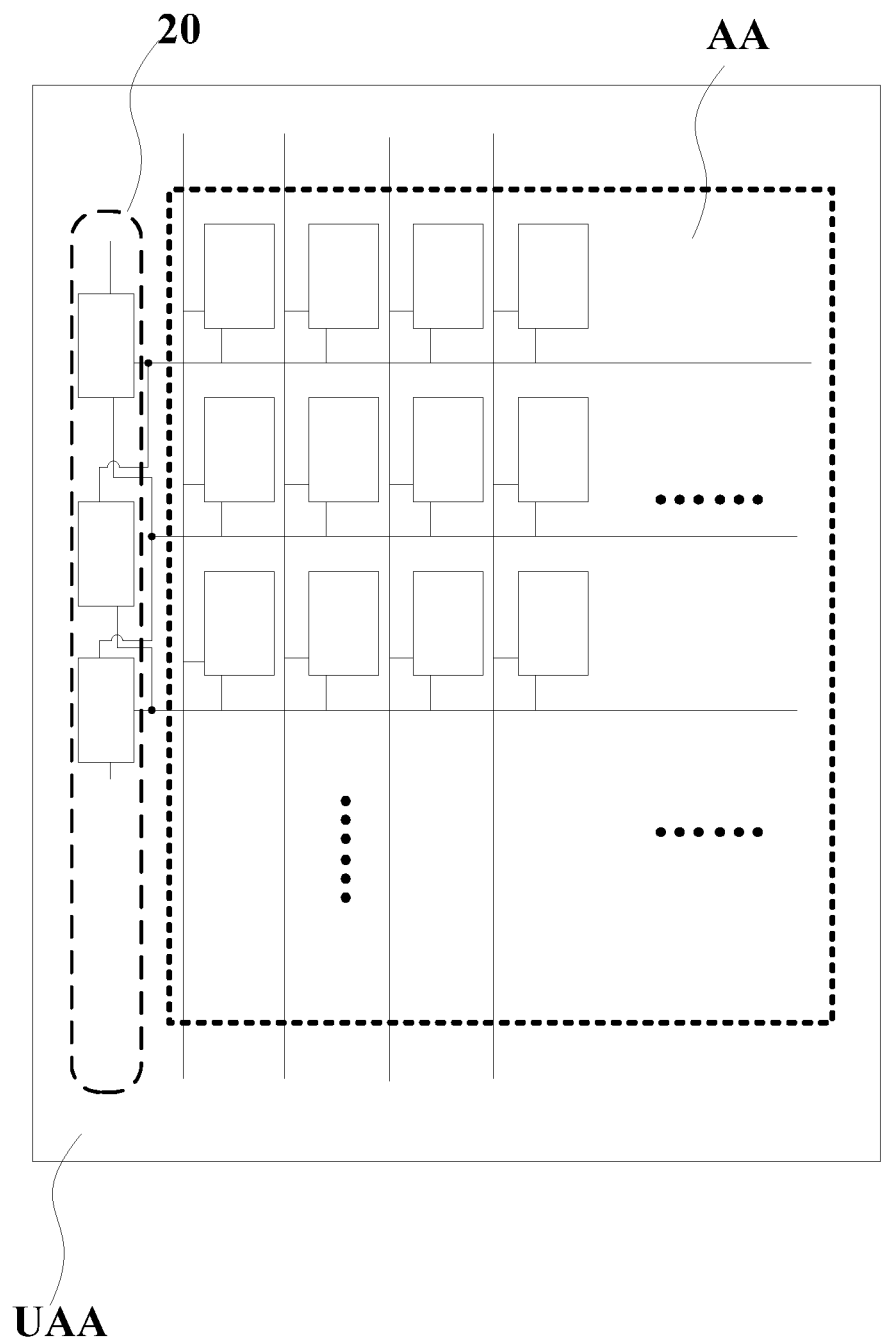
FIG. 11 is a block diagram of a display panel according to an embodiment of the present application.

An embodiment of the present application further provides a display panel. FIG. 11 is a block diagram of a display panel according to the embodiment of the present application. As shown in FIG. 11, the display panel includes a display region AA and a non-display region UAA at least partially surrounding the display region AA. The non-display region UAA is provided with a gate drive circuit 20, and the gate drive circuit 20 is the gate drive circuit as described in any one of the above embodiments.

The gate drive circuit 20, for example, may be disposed in the non-display region UAA on two opposite sides of the display region AA, or may be disposed only in the non-display region UAA on one side of the display region AA.

On the basis of the above embodiments, in an embodiment, the non-display area is further provided with a first power supply signal line, a second power supply signal line and multiple scan output lines. The first power supply signal terminal of each shift register is electrically connected to the first power supply signal line. Each shift register further includes a second power supply signal terminal. The second power supply signal terminal of each shift register is electrically connected to the second power supply signal line. Scan output terminals of the shift registers are electrically connected to the multiple scan output lines in a one-to-one correspondence.

Figure 12:
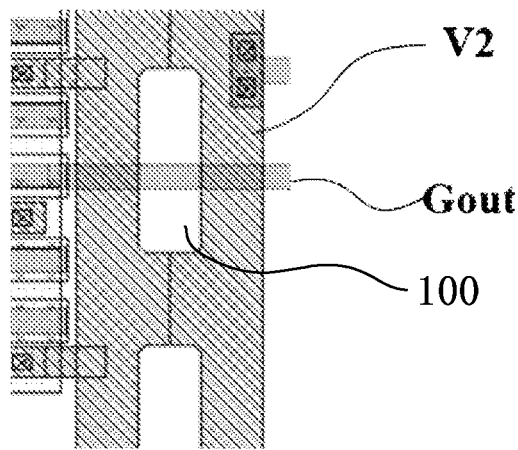
FIG. 12 is a partial layout diagram of a display panel.

Since the first output module and/or the second output module in each shift register may no longer be provided with a capacitor, the metal film layer used for the disposition of the capacitor in the original shift register can be removed. Therefore, it is not necessary to perform the wiring process on the scan output terminals of the shift registers and the multiple scan output lines to avoid the metal film layer of the capacitor, and the multiple scan output lines in the embodiment of the present application can be directly extended to be electrically connected to each scan line in the display region. The first power supply signal line and the second power supply signal line are generally manufactured in the same layer as the source and drain of each transistor, and the multiple scan output lines are generally manufactured in the same layer as the gate electrode of each transistor. FIG. 12 is a partial layout diagram of the display panel. As shown in FIG. 12, if a vertical projection of the first power supply signal line V1 and/or the second power supply signal line V2 on a plane in which the scan output lines are located overlaps the scan output lines Gout (in FIG. 11, exemplarily, the second power supply signal line V2 is set to be overlapped with the scan output lines Gout), in order to avoid crosstalk between signals, the first power supply signal line and/or the second power supply signal line is provided with a hollow structure 100 at an overlap.

An embodiment of the present application further provides a driving method of a display panel. The driving method may be executed by the display panel as described in any one of the above embodiments and the method includes the steps described below.

A potential of a second node is controlled to enable a second output module to be conductive, and a voltage signal is input through a first clock signal terminal and is output to a scan output terminal.

A potential of a first node is controlled to enable a first output module to be conductive, and a voltage signal is input through a first power supply signal terminal and is output to the scan output terminal.

In the embodiment of the present application, since the shift register as described in any one of the above embodiments is adopted to perform driving, and there is no capacitor in the first output module and/or the second output module of the shift register, the driving method of the display panel provided by this embodiment of the present application can reduce the power consumption of the display panel caused by the current leakage of the capacitive elements, as the capacitive elements are charged and discharged.

Figure 13:
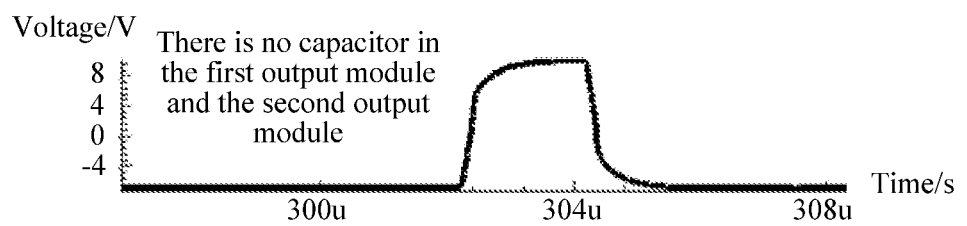
FIG. 13 is voltage signal versus time data charts illustrating comparison of output performance among shift registers provided by the embodiments of the present application and an existing shift register.
Figure 13:
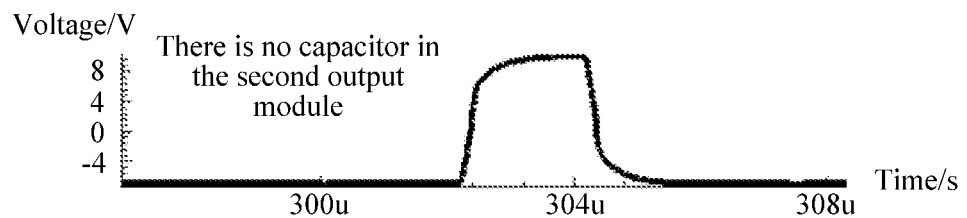
Figure 13:
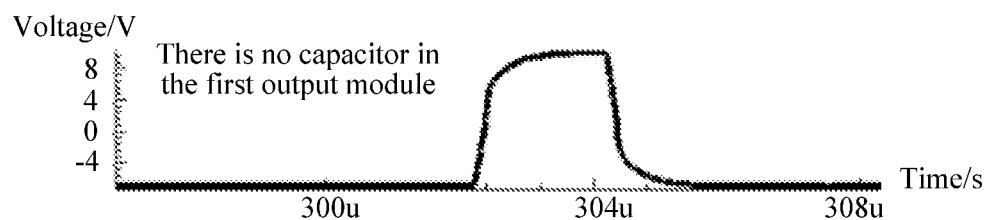
Figure 13:
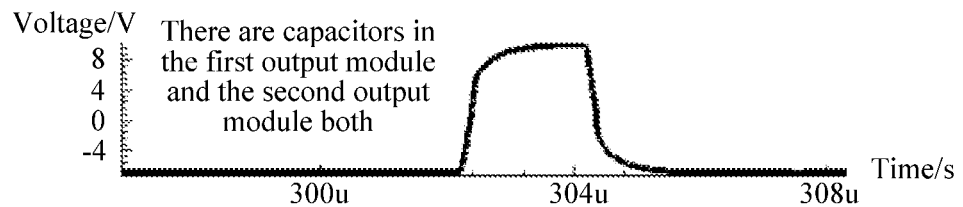

FIG. 13 is the voltage signal versus time data charts illustrating comparison of output performance among shift registers provided by the embodiments of the present application and an existing shift register. As shown in FIG. 13, the output performance of a shift register in which there is no capacitor in the first output module and the second output module, the output performance of a shift register in which there is no capacitor in the second output module, the output performance of a shift register in which there is no capacitor in the first output module, and the output performance of the existing shift register (in which there are capacitors in both the first output module and the second output module) are tested respectively. It can be found that removing the capacitor in the first output module and/or the second output module does not affect the output performance of the shift register.

What is claimed is:

1. A shift register, comprising: a first output module, a second output module, a first node, a second node, a first power supply signal terminal, a first clock signal terminal and a scan output terminal;
wherein the first output module and the second output module are electrically connected to the scan output terminal;
wherein the first output module is further electrically connected to the first power supply signal terminal and the first node, the first node is configured to control a conduction state of the first output module, and during the first output module conducting, a voltage signal input by the first power supply signal terminal is output to the scan output terminal;
wherein the second output module is electrically connected to the first clock signal terminal and the second node, wherein the second node is configured to control a conduction state of the second output module, and during the second output module conducting, a voltage signal input by the first clock signal terminal is output to the scan output terminal; and
wherein there is no capacitor in at least one of the first output module or the second output module;
wherein the shift register further comprises: a first node control module, a second node control module, a node mutual control module, a first shift input terminal, a first level signal terminal, a second clock signal terminal and a second power supply signal terminal; wherein the first node control module and the second node control module are electrically connected to the first level signal terminal;
wherein the first node control module is further electronically connected to the second clock signal terminal, the second power supply signal terminal and the first node; and the first node control module is configured to control a potential of the first node according to a voltage signal input by the first level signal terminal, a voltage signal input by the second clock signal terminal and a voltage signal input by the second power supply signal terminal,
wherein the second node control module is further electronically connected to the first shift input terminal and the second node; and the second node control module is configured to control a potential of the second node according to a voltage signal input by the first level signal terminal and a voltage signal input by the first shift input terminal; and
wherein the node mutual control module is electronically connected to the first node, the second node and the first power supply signal terminal; and the node mutual control module is configured to control the potential of the second node according to the potential of the first node, or control the potential of the first node according to the potential of the second node.

2. The shift register of claim 1, wherein the first output module comprises a first transistor, and the second output module comprises a second transistor;
wherein a gate of the first transistor is electrically connected to the first node, a first electrode of the first transistor is electrically connected to the first power supply signal terminal, and a second electrode of the first transistor is electrically connected to the scan output terminal;
wherein a gate of the second transistor is electrically connected to the second node, a first electrode of the second transistor is electrically connected to the first clock signal terminal, and a second electrode of the second transistor is electrically connected to the scan output terminal.

3. The shift register of claim 2, wherein at least one of a channel's width/length (W/L) ratio of the first transistor or a channel's W/L ratio of the second transistor is greater than 45.

4. The shift register of claim 1,
wherein the first node control module comprises a third transistor and a fourth transistor;
wherein a gate of the third transistor is electrically connected to a second electrode of the fourth transistor, a first electrode of the third transistor is electrically connected to the second power supply signal terminal, a second electrode of the third transistor is electrically connected to the first node, a first electrode of the fourth transistor is electrically connected to the second clock signal terminal, and a gate of the fourth transistor is electrically connected to the first level signal terminal;
wherein the second node control module comprises a fifth transistor; wherein a gate of the fifth transistor is electrically connected to the first shift input terminal, a first electrode of the fifth transistor is electrically connected to the first level signal terminal, and a second electrode of the fifth transistor is electrically connected to the second node; and wherein the node mutual control module comprises a sixth transistor and a seventh transistor; wherein a gate of the sixth transistor is electrically connected to the first node, a first electrode of the sixth transistor is electrically connected to the first power supply signal terminal, a second electrode of the sixth transistor is electrically connected to the second node, a gate of the seventh transistor is electrically connected to the second node, a first electrode of the seventh transistor is electrically connected to the first power supply signal terminal, and a second electrode of the seventh transistor is electrically connected to the first node.

5. The shift register of claim 4, wherein a channel's W/L ratio of the fifth transistor is at least two times or larger than a channel's W/L ratio of any transistor in the node mutual control module.

6. The shift register of claim 4, further comprising a tenth transistor; wherein a gate of the tenth transistor is electrically connected to the second power supply signal terminal, a first electrode of the tenth transistor is electrically connected to the second node, and a second electrode of the tenth transistor is electrically connected to the second output module.

7. The shift register of claim 1, further comprising: a second shift input terminal, a second level signal terminal and a third clock signal terminal;

wherein the second node control module and the first node control module are electrically connected to the second level signal terminal; the second node control module is further electrically connected to the second shift input terminal; and the third clock signal terminal is electrically connected to the first node control module;

wherein the first node control module is configured to control the potential of the first node according to a voltage signal input by the first level signal terminal, a voltage signal input by the second level signal terminal, a voltage signal input by the second clock signal terminal, a voltage signal input by the third clock signal terminal and a voltage signal input by the second power source signal terminal; and wherein the second node control module is configured to control the potential of the second node according to a voltage signal input by the first level signal terminal, a voltage signal input by the second level signal terminal, a voltage signal input by the first shift input terminal and a voltage signal input by the second shift input terminal.

8. The shift register of claim 7, wherein the first node control module comprises a third transistor, a fourth transistor and an eighth transistor; wherein a second electrode of the fourth transistor and a second electrode of the eighth transistor are electrically connected to a gate of the third transistor;

wherein first electrode of the third transistor is electrically connected to the second power supply signal terminal;

wherein a second electrode of the third transistor is electrically connected to the first node; a first electrode of the fourth transistor is electrically connected to the second clock signal terminal;

wherein a gate of the fourth transistor is electrically connected to the first level signal terminal; a gate of the eighth transistor is electrically connected to the second level signal terminal;

wherein a first electrode of the eighth transistor is electrically connected to the third clock signal terminal;

wherein the second node control module comprises a fifth transistor and a ninth transistor; wherein a gate of the fifth transistor is electrically connected to the first shift input terminal; a first electrode of the fifth transistor is electrically connected to the first level signal terminal; a second electrode of the fifth transistor is electrically connected to the second node;

wherein a gate of the ninth transistor is electrically connected to the second shift input terminal; a first electrode of the ninth transistor is electrically connected to the second level signal terminal; and a second electrode of the ninth transistor is electrically connected to the second node; wherein the node mutual control module comprises a sixth transistor and a seventh transistor; wherein a gate of the sixth transistor is electrically connected to the first node; a first electrode of the sixth transistor is electrically connected to the first power supply signal terminal;

wherein a second electrode of the sixth transistor is electrically connected to the second node; a gate of the seventh transistor is electrically connected to the second node; a first electrode of the seventh transistor is electrically connected to the first power supply signal terminal; and wherein a second electrode of the seventh transistor is electrically connected to the first node.

9. The shift register of claim 8, wherein a channel's W/L ratio of the fifth transistor is at least two times or larger than a channel's W/L ratio of any transistor in the node mutual control module.

10. The shift register of claim 8, wherein a channel's width-to-length ratio of the ninth transistor is at least two times or larger than a channel's W/L ratio of any transistor in the node mutual control module.

11. The shift register of claim 7, further comprising a tenth transistor; wherein a gate of the tenth transistor is electrically connected to the second power supply signal terminal, a first electrode of the tenth transistor is electrically connected to the second node, and a second electrode of the tenth transistor is electrically connected to the second output module.

12. The shift register of claim 1, further comprising a tenth transistor; wherein a gate of the tenth transistor is electrically connected to the second power supply signal terminal, a first electrode of the tenth transistor is electrically connected to the second node, and a second electrode of the tenth transistor is electrically connected to the second output module.

13. A gate drive circuit, comprising cascaded shift registers of claim 1, wherein each of the shift registers further comprises a first shift input terminal;

wherein the first shift input terminal of the shift register at a first stage is electrically connected to a start signal input terminal of the gate drive circuit, and the scan output terminal of the shift register at an i-th stage is electrically connected to the first shift input terminal of the shift register at a (i+1)-th stage; wherein i is a positive integer.

14. The gate drive circuit of claim 13, wherein each of the shift registers further comprises a second shift input terminal; and wherein the scan output terminal of the shift register at the (i+1)-th stage is electrically connected to the second shift input terminal of the shift register at the i-th stage.

15. A display panel, comprising a display region and a non-display region at least partially surrounding the display region, wherein the non-display region is provided with a gate drive circuit, and the gate drive circuit is the gate drive circuit of claim 14.

16. A display panel, comprising a display region and a non-display region at least partially surrounding the display region, wherein the non-display region is provided with a gate drive circuit, and the gate drive circuit is the gate drive circuit of claim 13.

17. The display panel of claim 16, wherein the non-display area is further provided with a first power supply signal line, a second power supply signal line, and a plurality of scan output lines;
   wherein the first power supply signal terminal of each shift register is electrically connected to the first power supply signal line;
   wherein each shift register further comprises a second power supply signal terminal, the second power supply signal terminal of each shift register is electrically connected to the second power supply signal line; and
   wherein the scan output terminal of each shift register is electrically connected to a respective one of the plurality of scan output lines in a one-to-one correspondence; and
   wherein a vertical projection of at least one of the first power supply signal line or the second power supply signal line on a plane in which the scan output lines are located overlaps the scan output lines; and at least one of the first power supply signal line or the second power supply signal line is provided with a hollow structure at an overlap.

18. A driving method of the display panel of claim 17, comprising:
   controlling a potential of the second node to enable the second output module to be conductive, inputting a voltage signal through the first clock signal terminal, and outputting the signal input through the first clock signal terminal to the scan output terminal; and
   controlling a potential of the first node to enable the first output module to be conductive, inputting a voltage signal through the first power supply signal terminal, and outputting the signal input through the first power supply signal terminal to the scan output terminal.

19. A driving method of the display panel of claim 16, comprising:
   controlling a potential of the second node to enable the second output module to be conductive, inputting a voltage signal through the first clock signal terminal, and outputting the signal input through the first clock signal terminal to the scan output terminal; and
   controlling a potential of the first node to enable the first output module to be conductive, inputting a voltage signal through the first power supply signal terminal, and outputting the signal input through the first power supply signal terminal to the scan output terminal.

* * * * *